United States Patent
Von Berg

(10) Patent No.: US 10,203,230 B2
(45) Date of Patent: Feb. 12, 2019

(54) MULTITURN ROTARY ENCODERS

(71) Applicant: DR. JOHANNES HEIDENHAIN GMBH, Traunreut (DE)

(72) Inventor: Martin Von Berg, Übersee (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 705 days.

(21) Appl. No.: 14/555,886

(22) Filed: Nov. 28, 2014

(65) Prior Publication Data

US 2015/0149101 A1 May 28, 2015

(30) Foreign Application Priority Data

Nov. 28, 2013 (DE) .................... 10 2013 224 375

(51) Int. Cl.
  *G01D 15/00* (2006.01)
  *G01R 31/36* (2006.01)
  *G01D 5/245* (2006.01)

(52) U.S. Cl.
  CPC ........... *G01D 15/00* (2013.01); *G01D 5/2454* (2013.01); *G01R 31/3606* (2013.01)

(58) Field of Classification Search
  CPC .... G01D 15/00; G01D 5/2454; G01D 5/3473; G01D 5/34776; G01R 31/3606; G01R 31/3679

(Continued)

(56) References Cited

U.S. PATENT DOCUMENTS

| 4,204,201 A | * | 5/1980 | Williams | ............... G08B 19/00 340/517 |
| 4,990,909 A | * | 2/1991 | Ueda | ...................... G01D 5/145 250/231.13 |

(Continued)

FOREIGN PATENT DOCUMENTS

| CN | 1511276 A | 7/2004 |
| DE | 10 2008 015 837 | 10/2009 |

(Continued)

OTHER PUBLICATIONS

Wright, Gus. Fundamentals of MediumHeavy Duty Diesel Engines. Jones and Bartlett Publishers, Inc, 2015.*

(Continued)

*Primary Examiner* — Ly D Pham
(74) *Attorney, Agent, or Firm* — Hunton Andrews Kurth LLP

(57) ABSTRACT

A multiturn rotary encoder includes: a measuring standard having at least one graduation track, with whose aid the angular position of a shaft is absolutely encoded; a first scanner, with which the at least one graduation track is able to be scanned in order to generate first position signals; a first single-turn evaluation unit for forming a first single-turn code word from the first position signals; a first multiturn evaluation unit for forming a first multiturn code word from the first position signals; a second scanner, with which the at least one graduation track is able to be scanned in order to generate second position signals; a second single-turn evaluation unit for forming a second single-turn code word from the second position signals; a second multiturn evaluation unit for forming a second multiturn code word from the second position signals; and a battery, with which at least the components necessary for forming the multiturn code words are able to be supplied with energy upon loss of a main power supply. A first battery-monitoring unit is provided, (Continued)

with which the functioning of the battery is able to be monitored and indicated by at least one battery-status signal.

12 Claims, 3 Drawing Sheets

(58) Field of Classification Search
USPC .................................................. 702/63
See application file for complete search history.

(56) References Cited

U.S. PATENT DOCUMENTS

| | | | | |
|---|---|---|---|---|
| 6,242,891 | B1* | 6/2001 | Parsonage | G01R 19/16542 320/132 |
| 6,912,797 | B2* | 7/2005 | Rodi | G01B 7/003 33/706 |
| 7,471,080 | B2* | 12/2008 | Sasaki | G01D 5/24428 324/174 |
| 8,154,427 | B2 | 4/2012 | Mayer et al. | |
| 8,319,492 | B2* | 11/2012 | Schmidt | G01D 5/24447 324/200 |
| 8,339,126 | B2 | 12/2012 | Izak et al. | |
| 8,618,466 | B2 | 12/2013 | Ehrenberg et al. | |
| 2010/0078468 | A1 | 4/2010 | Wheeler et al. | |
| 2012/0143585 | A1* | 6/2012 | Barsukov | G01R 31/362 703/18 |
| 2014/0212714 | A1* | 7/2014 | Butzmann | H01M 10/48 429/90 |

FOREIGN PATENT DOCUMENTS

| | | |
|---|---|---|
| DE | 10 2009 029 431 | 3/2011 |
| EP | 1 462 771 | 9/2004 |
| EP | 1 617 180 | 1/2006 |
| EP | 1 770 372 | 4/2007 |
| JP | H03-33613 A | 2/1991 |
| JP | 2004-108927 A | 4/2004 |
| JP | 2006-500688 A | 1/2006 |
| JP | 2007-292608 A | 11/2007 |
| JP | 2008-180698 A | 8/2008 |
| WO | 2011/042190 | 4/2011 |

OTHER PUBLICATIONS

"Smart Tweezers Professional High-Precision R-L-C Meter." Www.bookar.com, Bookar International, Nov. 29, 2007, www.yeint.fi/files/products/Smart_tweezer.pdf.*

Vinson, James E. ESD Design and Analysis Handbook. Kluwer Academic Publishers, 2003.*

European Search Report, dated Mar. 17, 2015, issued in corresponding European Patent Application No. 14 183 489.5.

Notification of Reasons for Refusal issued in Japanese Patent Application No. 2014-235283 dated Aug. 1, 2018, 6 pages total (with English-language translation).

* cited by examiner

MULTITURN ROTARY ENCODERS

CROSS-REFERENCE TO RELATED APPLICATIONS

The present application claims priority to Application No. 10 2013 224 375.8, filed in the Federal Republic of Germany on Nov. 28, 2013, which is expressly incorporated herein in its entirety by reference thereto.

FIELD OF THE INVENTION

The present invention relates to multiturn rotary encoders and methods for operating multiturn rotary encoders. Multiturn rotary encoders are often used in automation technology to measure the angular positions and the number of revolutions executed by shafts.

BACKGROUND INFORMATION

Position-measuring devices for measuring the angular position of a shaft are described in a multitude of publications. Such position-measuring devices are referred to as rotary encoders. Moreover, position-measuring devices designed with which, in addition to the angular position of the shaft, it is also possible to measure the number of revolutions executed by the shaft are referred to as multiturn rotary encoders.

In principle, two design approaches are used for realizing the multiturn unit, e.g., the unit for determining the number of revolutions executed by the shaft, first of all, multiturn units based on gears, and secondly, multiturn units based on counters.

Counter-based multiturn units ascertain the number of revolutions executed by a shaft by counting the revolutions of a code carrier which is driven directly by the shaft, and therefore executes the same number of revolutions as the shaft to be measured. Located on the code carrier is a code which is scanned by a scanning unit. Based on the position signals ascertained by the scanning unit, counting signals are generated in counter electronics for a counter which counts, as a function of the direction of rotation, the number of complete revolutions of the code carrier, and therefore of the shaft.

In order to store the counter reading of the counter even when the main power supply is switched off, for example, when the machine in which the multiturn rotary encoder is operated is switched off, and in addition, to maintain the counting function, counter-based multiturn units are frequently equipped with a battery which takes over the energy supply for at least the multiturn unit of the rotary encoder upon loss of the main power supply.

For example, European Patent No. 1 462 771 describes a multiturn rotary encoder having a counter-based multiturn unit which is operated with a battery when in the switched-off state.

German Published Patent Application No. 10 2008 015 837 describes a position-measuring device based on an inductive scanning principle that has a battery operation. This position-measuring device is also suited to be implemented as a multiturn rotary encoder.

For safety-related reasons, it may be necessary to measure the number of revolutions of a shaft redundantly, for example, when a faulty measurement may lead to damage of a machine on which the multiturn rotary encoder is operated, or may even result in danger for the operating personnel of the machine.

Therefore, German Published Patent Application No. 10 2009 029 431 describes a multiturn rotary encoder which is equipped with two mutually independent multiturn units. A comparison of the measured values of the multiturn units makes it possible to check the performance reliability of the multiturn rotary encoder at all times. It is therefore suitable for use in safety-related applications.

However, if two counter-based multiturn units are used in such a multiturn rotary encoder, each of which is supplied with energy from a battery for operation in the switched-off state, then in rare cases, fault conditions may still arise which have the same effect on both multiturn units, and therefore cannot immediately be discovered.

SUMMARY

Example embodiments of the present invention provide a multiturn rotary encoder having improved operational reliability and provide a method for operating such a multiturn rotary encoder.

According to an example embodiment of the present invention, a multiturn rotary encoder includes: a measuring standard having at least one graduation track, with whose aid the angular position of a shaft is absolutely encoded; a first scanner, with which the at least one graduation track is able to be scanned in order to generate first position signals; a first single-turn evaluation unit for forming a first single-turn code word from the first position signals; a first multiturn evaluation unit for forming a first multiturn code word from the first position signals; a second scanner, with which the at least one graduation track is able to be scanned in order to generate second position signals; a second single-turn evaluation unit for forming a second single-turn code word from the second position signals; a second multiturn evaluation unit for forming a second multiturn code word from the second position signals; a battery, with which at least the components necessary for forming the multiturn code words are able to be supplied with energy upon loss of a main power supply; and a first battery-monitoring unit, with which the functioning of the battery is able to be monitored and indicated by at least one battery-status signal.

According to an example embodiment of the present invention, a method for operating a multiturn rotary encoder having: a measuring standard having at least one graduation track, with whose aid the angular position of a shaft is absolutely encoded; a first scanner, with which the at least one graduation track is able to be scanned in order to generate first position signals; a first single-turn evaluation unit for forming a first single-turn code word from the first position signals; a first multiturn evaluation unit for forming a first multiturn code word from the first position signals; a second scanner, with which the at least one graduation track is able to be scanned in order to generate second position signals; a second single-turn evaluation unit for forming a second single-turn code word from the second position signals; a second multiturn evaluation unit for forming a second multiturn code word from the second position signals; a battery, with which at least the components necessary for forming the multiturn code words are able to be supplied with energy upon loss of a main power supply; includes monitoring the functioning of the battery by a first battery-monitoring unit and indicating the functioning of the battery by at least one battery-status signal.

Further features and aspects of example embodiments of the present invention are described in more detail below with reference to the appended Figures.

DETAILED DESCRIPTION

Figure 1:
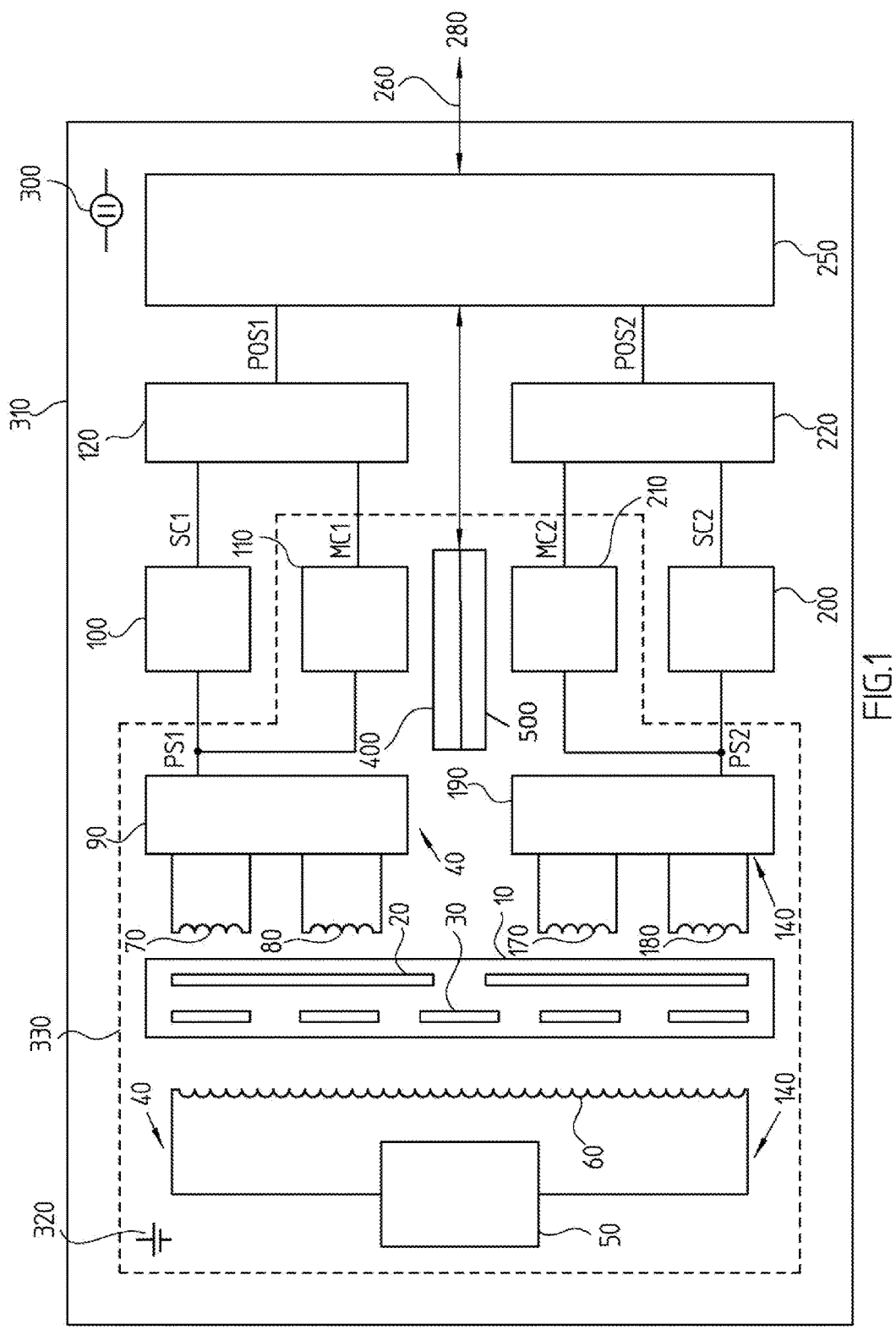
FIG. 1 is a block diagram of a multiturn rotary encoder according to an example embodiment of the present invention.

FIG. 1 is a block diagram of a multiturn rotary encoder according to an example embodiment of the present invention. It is based on an inductive scanning principle as described, for example, in German Published Patent Application No. 10 2008 015 837, which is expressly incorporated herein in its entirety by reference thereto.

It should be understood, however, that the described scanning principle is not intended to be limiting. Thus, for example, photoelectric, magnetic or capacitive scanning principles may also be used.

The multiturn rotary encoder has a measuring standard 10 having at least one graduation track, with whose aid the angular position of a shaft is absolutely encoded. In the example illustrated, measuring standard 10 includes two graduation tracks 20, 30, measuring standard 10 and graduation tracks 20, 30 only being illustrated schematically. Measuring standard 10 may take the form of a code disk, for instance, which is joined in rotatably fixed manner to the shaft whose angular position/number of revolutions is/are to be measured. Graduation tracks 20, 30 may include electrically conductive and non-conductive sections which are disposed concentrically on various radii about the rotational midpoint of the code disk.

In this example, the angular position to be measured is analog encoded, that is, upon scanning graduation tracks 20, 30, analog scanning signals are obtained, from whose amplitudes and/or phase relations it is possible to determine the angular position of input shaft W. Alternatively, however, the angular position may also be digitally encoded, e.g., in that the graduation tracks have a multi-track digital code, for instance, a Gray code, or a single-track chain code, e.g., a Pseudo Random Code (PRC). For example, a digital coding may be used in the case of photoelectric scanning principles.

To generate first position signals PS1, a first scanner 40 is provided. It includes an excitation unit 50 which, in conjunction with an excitation coil 60, generates an electromagnetic field whose strength is influenced by graduation tracks 20, 30. To detect the electromagnetic field, two pairs of first receiver coils 70, 80 are provided, each pair of receiver coils 70, 80 generating position signals that are out-of-phase with each other and which make it possible to detect position as a function of the direction of rotation. In this context, first receiver-coil pair 70 is used to scan first graduation track 20, and second receiver-coil pair 80 is used to scan second graduation track 30. During operation, voltages are induced in receiver coils 70, 80, the amplitude of the voltages being a function of the angular position of the code disk, e.g., of the shaft to be measured. The induced voltages are supplied to a first signal-processing unit 90 in which they are filtered and amplified, for example, before they are output as first position signals PS1 first of all to a first single-turn evaluation unit 100, and secondly, to a first multiturn evaluation unit 110.

First single-turn evaluation unit 100 processes first position signals PS1 to form a first single-turn code word SC1 that indicates the angular position of the shaft to be measured.

On the other hand, first multiturn evaluation unit 110 processes first position signals PS1 to form a first multiturn code word MC1 that indicates the number of revolutions executed by the shaft to be measured. To that end, first multiturn evaluation unit 110 may include a counter, for example, which counts applicable events of first position signals PS1 as a function of the direction of rotation.

The zero point of the measurement may be determined manually or, for example, by reaching a limit switch or etc. To set the zero point from which the counting of the revolutions begins, it is usually necessary to perform a reference execution before the actual operation of the machine.

First single-turn code word SC1 and first multiturn code word MC1 are ultimately fed to a first code-connecting unit 120 which, from the two values, forms a common first position value POS1 that includes both the instantaneous angular position and the number of revolutions executed.

To form a redundant second position value POS2, all the units indicated are provided identically a second time, with the exception of excitation unit 50 with excitation coil 60.

Thus, to form second position signals PS2, a second scanner 140 is provided. It likewise is assigned excitation unit 50 and excitation coil 60, which together generate the electromagnetic field. To detect the electromagnetic field modulated by graduation tracks 20, 30, two pairs of second receiver coils 170, 180 are provided, each pair of receiver coils 170, 180 generating position signals which are out-of-phase with each other and which make it possible to detect position as a function of the direction of rotation. In this context, first receiver-coil pair 170 is used to scan first graduation track 20, and second receiver-coil pair 180 is used to scan second graduation track 30. A second signal-processing unit 190 processes the induced voltages to form second position signals PS2.

Thus, the second scanner includes second receiver coils 170, 180 and second signal-processing unit 190, in addition to excitation unit 50 and excitation coil 60, which it shares with first scanner 40.

Second position signals PS2 are supplied to a second single-turn evaluation unit 200 to form a second single-turn code word SC2, and to a second multiturn evaluation unit 210 to form a second multiturn code word MC2. A second code-connecting unit 220 ultimately forms second position value POS2 from second single-turn code word SC2 and second multiturn code word MC2.

For communication with sequential electronics 280, an interface unit 250 is provided which receives commands and data from sequential electronics 280 via a data-transmission channel 260, and transmits data (as the result of commands received) to sequential electronics 280. Interface unit 250 may take the form of a serial interface, that is, data is transmitted via data-transmission channel 260 in the form of serial data streams, possibly synchronized by a clock signal.

In this example, position values POS1, POS2 are fed to interface unit 250, and may be transmitted to sequential electronics 280, for example, as the result of a position-request command. Alternatively, multiturn code words MC1, MC2 and single-turn code words SC1, SC2 may also be supplied directly to interface unit 250 for separate transmission to sequential electronics 280. In this case, code-connecting units 120, 220 may possibly be omitted.

During normal operation, all components necessary for forming position values POS1, POS2 and for communication with sequential electronics 280 are supplied with energy by a main power supply 300. In FIG. 1, this pertains to all components located in area 310.

In the event main power supply 300 is lost, in order to be able to continue to store multiturn code words MC1, MC2 and to count the revolutions executed, the components necessary for this are supplied with energy by a battery 320 in a battery-supported area 330. The switchover from normal operation with supply by main power supply 300 to battery operation with supply of battery-supported area 330 by battery 320 and vice versa may take place automatically in response to a drop below or exceeding of a minimum value of output voltage V+ of main power supply 300.

Because two multiturn code words MC1, MC2 are generated substantially independently of each other in a multiturn rotary encoder, high operational reliability may be achieved. To further increase the probability of recognizing a malfunction in generating multiturn code words MC1, MC2, particularly during battery operation, a first battery-monitoring unit 400 is provided in the multiturn rotary encoder, which monitors the functioning of the battery and indicates it to the interface unit by at least one battery-status signal. In this manner, for example, a failure (or an imminent failure) of the battery may be indicated to sequential electronics 280.

In order to satisfy even higher safety standards, a redundant second battery-monitoring unit 500 may be provided.

The battery is functioning properly when, first of all, it has a sufficient charge level, that is, battery voltage $V_{BAT}$ reaches a minimum value needed for functioning. Secondly, it is also necessary that battery voltage $V_{BAT}$ be available continuously during battery operation, since any interruption or drop below the minimum voltage needed for operation, even only for a short time, may mean a deletion of multiturn code words MC1, MC2, since the relevant components (counter, etc.) are not supplied or are supplied only insufficiently with energy. An interruption occurs, for example, when, with the machine switched off, battery 320 is exchanged improperly.

Figure 2:
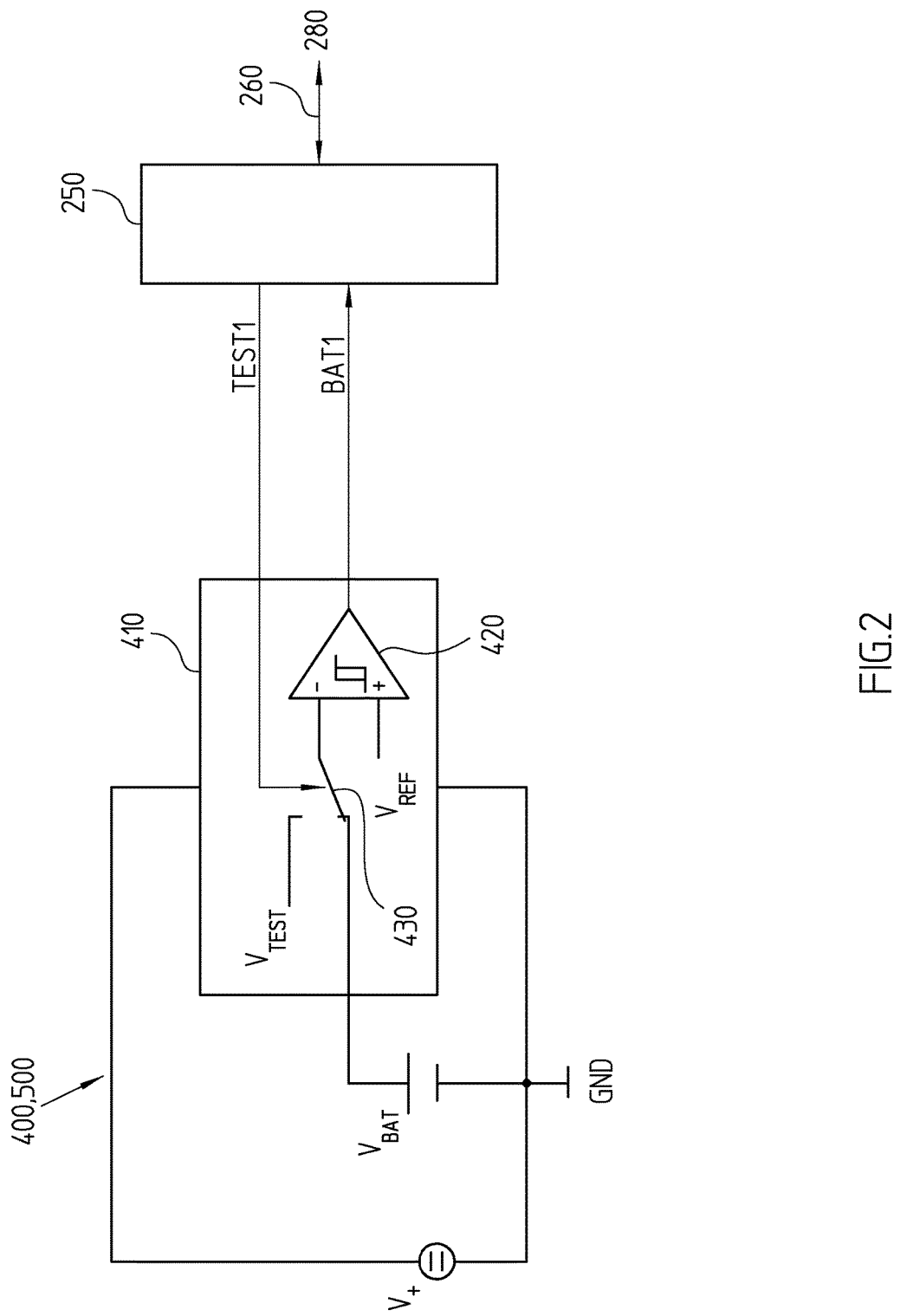
FIG. 2 is a circuit diagram of a state-of-charge monitoring unit.

To determine whether the state of charge of the battery satisfies the requirements, a state-of-charge monitoring unit 410 is provided in the first battery-monitoring unit. FIG. 2 shows a functional circuit diagram of a state-of-charge monitoring unit 410, for example.

Battery voltage $V_{BAT}$ is supplied to state-of-charge monitoring unit 410. It is suitably designed, for example, by comparing battery voltage $V_{BAT}$ to a reference voltage $V_{REF}$, to determine whether battery voltage $V_{BAT}$ reaches the minimum value required. State-of-charge monitoring unit 410 outputs the result of the comparison as first battery-status signal BAT1. The comparison is carried out in a comparator unit 420, which may be a simple comparator module.

First battery-status signal BAT1 is fed to interface unit 250, and may be transmitted from there to sequential electronics 280. This may take place in response to direct query by command, or automatically as part of a data packet which also contains position data POS1, POS2.

State-of-charge monitoring unit 410 may also include a plurality of comparator units 420, so that, for example, by comparing battery voltage $V_{BAT}$ to a voltage just barely permissible for operation, a further battery-status signal may be generated that is to be interpreted as a failure warning, so that a battery may be exchanged prior to an actual failure.

Since a low battery voltage $V_{BAT}$ normally represents a static state of battery 320, state-of-charge monitoring unit 410 is supplied with energy by main power supply 300.

In order to be able to ensure that the value of first battery-status signal BAT1 is obtained due to an actual voltage comparison and not, for instance, because of a malfunction of comparator unit 420, for example, a first switching element 430 which, controlled by a first test signal TEST1, switches the voltage to be checked at the input of comparator unit 420 from battery voltage $V_{BAT}$ to a test voltage $V_{TEST}$, is also disposed in state-of-charge monitoring unit 410. Test voltage $V_{TEST}$ is selected such that comparator unit 420 must recognize a state of charge of battery 320 which is too low and signal it with the aid of first battery-status signal BAT1. In this manner, too low a state of charge of battery 320 is caused artificially, and the functioning of state-of-charge monitoring unit 410 is able to be checked. For example, test signal TEST1 may be controlled by commands of sequential electronics 280, which are transmitted via data-transmission channel 260 to interface unit 250 of the multiturn rotary encoder.

Figure 3:
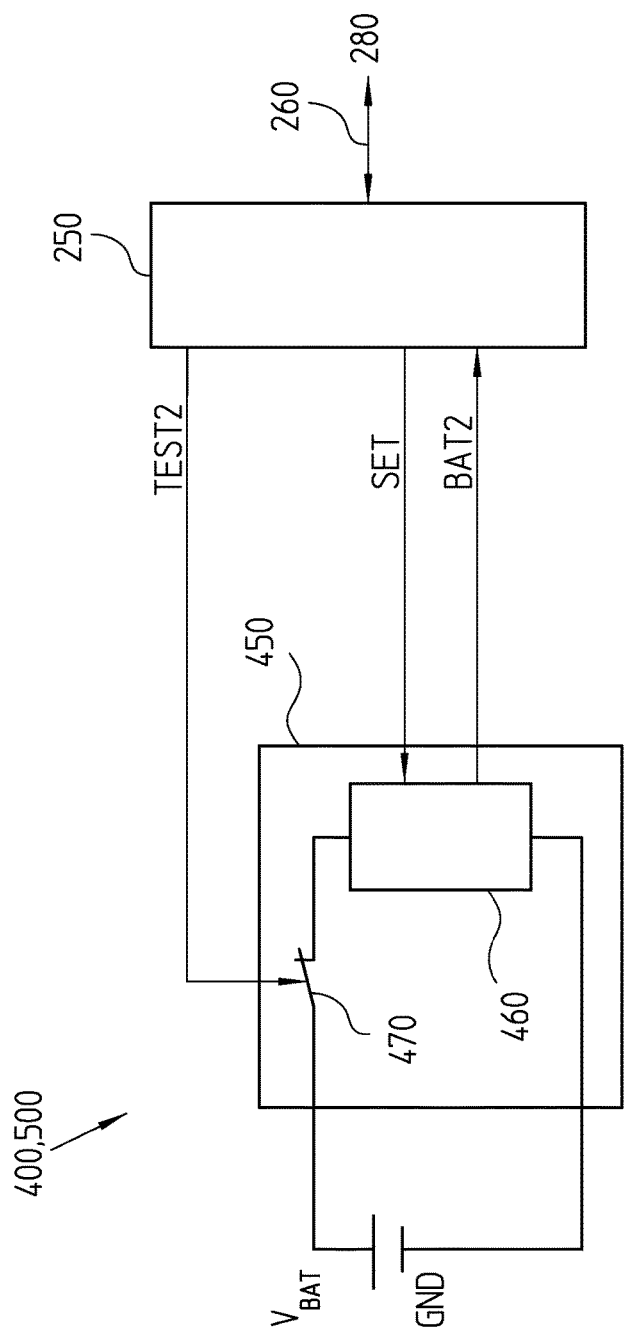
FIG. 3 is a circuit diagram of a continuity-monitoring unit.

To check the continuity of battery voltage $V_{BAT}$, first battery-monitoring unit 400 includes a continuity-monitoring unit 450, which is suitably designed to determine—at least with main power supply 300 switched off, thus, during battery operation—a short-term cessation of voltage, (e.g., during a battery exchange) as well as possibly a drop below a minimum voltage needed for reliable operation, and to indicate it by a second battery-status signal BAT2. FIG. 3 is a circuit diagram illustrating such a unit.

Continuity-monitoring unit 450 includes a memory unit 460 which is fed by battery voltage $V_{BAT}$. With main power supply 300 switched on, memory unit 460 may be programmed via a set signal SET to a defined value which changes as a result of a discontinuity of battery voltage $V_{BAT}$.

In a very simple implementation, memory unit 460 includes a flip-flop module (e.g., D flip-flop), which may be programmed by set signal SET (per command of sequential electronics 280) to a defined logic level, e.g., a high level. The high level is output as second battery-status signal BAT2 (e.g., to interface unit 250) and signals a fault-free operation. If battery voltage $V_{BAT}$ drops out (for example, due to removal of battery 320), or drops below a threshold value, then the logical high level is canceled (resetting of the flip-flop module). If battery voltage $V_{BAT}$ reaches the value necessary for operation again, then the flip-flop module remains reset and the discontinuity of battery voltage $V_{BAT}$ which has occurred is indicated by memory unit 460 as logical low level by second battery-status signal BAT2. To monitor battery voltage $V_{BAT}$ and to produce a defined state (in the example above, the explicit setting of second battery-status signal BAT2 to logical low level) after battery voltage $V_{BAT}$ has reached the necessary value again, a reset module may be provided in memory unit 460.

A possibility is also provided in continuity-monitoring unit 450 to artificially cause a discontinuity of battery voltage $V_{BAT}$, namely, with the aid of a second switching element 470 that is able to be controlled by a second test signal TEST2. An opening of second switching element 470 breaks the connection of battery voltage $V_{BAT}$ to memory unit 460 and thus forces an erasure of memory unit 460. Second test signal TEST2 may again be controlled by sequential electronics 280. Instead of a break, the switching of second switching element 470 may also bring about a switchover from battery voltage $V_{BAT}$ to a test voltage which is below the value at which memory unit 460 is erased.

It should be understood that the foregoing description should not be considered to be limiting and that alternative arrangements are possible without departing from the spirit and scope hereof.

What is claimed is:

1. A multiturn rotary encoder, comprising:
   a measuring standard having at least one graduation track that encodes an absolute angular position of a shaft;
   a first scanner adapted to scan the graduation track in order to generate first position signals;
   a first single-turn evaluation unit adapted to form a first single-turn code word from the first position signals;
   a first multiturn evaluation unit adapted to form a first multiturn code word from the first position signals;
   a second scanner adapted to scan the graduation track in order to generate second position signals;
   a second single-turn evaluation unit adapted to form a second single-turn code word from the second position signals;
   a second multiturn evaluation unit adapted to form a second multiturn code word from the second position signals;
   a battery adapted to supply energy to the first multiturn evaluation unit and the second multiturn evaluation unit upon loss of a main power supply; and
   a first battery-monitoring unit adapted to monitor functioning of the battery and to indicate the functioning of the battery by at least one battery-status signal;
   wherein the first battery-monitoring unit includes a state-of-charge monitoring unit adapted to determine and indicate a state of charge of the battery by a first battery-status signal; and
   wherein the first battery-monitoring unit includes a continuity-monitoring unit adapted to determine an interruption of presence of a battery voltage of the battery and to indicate the interruption of the presence of the battery voltage by a second battery-status signal.

2. The multiturn rotary encoder according to claim 1, wherein the state-of-charge monitoring unit is adapted to determine the state of charge of the battery by comparing a battery voltage to a reference voltage in a comparator unit.

3. The multiturn rotary encoder according to claim 1, wherein a first test signal, adapted to artificially produce a faulty state of charge of the battery, is suppliable to the state-of-charge monitoring unit.

4. The multiturn rotary encoder according to claim 1, wherein a second test signal adapted to artificially cause a discontinuity of the battery voltage is suppliable to the continuity-monitoring unit.

5. The multiturn rotary encoder according to claim 1, further comprising a memory unit, a discontinuity of the battery voltage causing a change in memory contents of the memory unit.

6. The multiturn rotary encoder according to claim 1, further comprising a redundant second battery-monitoring unit.

7. A method for operating a multiturn rotary encoder that includes: a measuring standard having at least one graduation track that encodes an absolute angular position of a shaft; a first scanner adapted to scan the graduation track in order to generate first position signals; a first single-turn evaluation unit adapted to form a first single-turn code word from the first position signals; a first multiturn evaluation unit adapted to form a first multiturn code word from the first position signals; a second scanner adapted to scan the graduation track in order to generate second position signals; a second single-turn evaluation unit adapted to form a second single-turn code word from the second position signals; a second multiturn evaluation unit adapted to form a second multiturn code word from the second position signals; and a battery adapted to supply energy to the first multiturn evaluation unit and the second multiturn evaluation unit upon loss of a main power supply; the method comprising:
   monitoring functioning of the battery by a first battery-monitoring unit; and
   indicating the functioning of the battery by at least one battery-status signal;
   wherein the first battery-monitoring unit includes a state-of-charge monitoring unit, the method further comprising:
   determining a state of charge of the battery and indicating the state of charge by a first battery-status signal; and
   determining an interruption of presence of a battery voltage of the battery by a continuity-monitoring unit of the first battery-monitoring unit and indicating the interruption of presence of the battery voltage by a second battery-status signal.

8. The method according to claim 7, wherein the state of charge of the battery is determined by comparing a battery voltage to a reference voltage in a comparator unit.

9. The method according to claim 7, further comprising supplying a first test signal, with which a faulty state of charge of the battery is produced artificially, to the state-of-charge monitoring unit.

10. The method according to claim 7, further comprising supplying to the continuity-monitoring unit a second test signal, with which a discontinuity of the battery voltage is caused artificially.

11. The method according to claim 7, further comprising causing a change in memory contents of a memory unit by a discontinuity of the battery voltage.

12. A method for operating a multiturn rotary encoder, comprising:
   encoding an absolute angular position of a shaft in accordance with a measuring standard having at least one graduation track;
   scanning the graduation track by a first scanner to generate first position signals;
   forming, by a first single-turn evaluation unit, a first single-turn code word from the first position signals;
   forming, by a first multiturn evaluation unit, a first multiturn code word from the first position signals;
   scanning the graduation track by a second scanner to generate second position signals;
   forming, by a second single-turn evaluation unit, a second single-turn code word from the second position signals;
   forming, by a second multiturn evaluation unit, a second multiturn code word from the second position signals;
   supplying energy from a battery to the first multiturn evaluation unit and the second multiturn evaluation unit upon loss of a main power supply;
   monitoring functioning of the battery by a first battery-monitoring unit; and
   indicating the functioning of the battery by at least one battery-status signal;
   wherein the first battery-monitoring unit includes a state-of-charge monitoring unit, the method further comprising:
   determining a state of charge of the battery and indicating the state of charge by a first battery-status signal; and
   determining an interruption of presence of a battery voltage of the battery by a continuity-monitoring unit of the first battery-monitoring unit and indicating the interruption of presence of the battery voltage by a second battery-status signal.

* * * * *